(12) United States Patent
Alexander et al.

(10) Patent No.: US 7,138,815 B1
(45) Date of Patent: Nov. 21, 2006

(54) POWER DISTRIBUTION SYSTEM BUILT-IN SELF TEST USING ON-CHIP DATA CONVERTER

(75) Inventors: Mark A. Alexander, Boulder, CO (US); Sean A. Koontz, Prunedale, CA (US)

(73) Assignee: Xilinx, Inc., San Jose, CA (US)

( * ) Notice: Subject to any disclaimer, the term of this patent is extended or adjusted under 35 U.S.C. 154(b) by 110 days.

(21) Appl. No.: 10/746,587

(22) Filed: Dec. 24, 2003

(51) Int. Cl.
*G01R 31/02* (2006.01)
(52) U.S. Cl. ...................................... 324/763
(58) Field of Classification Search ............ 324/158.1, 324/765, 763, 760; 702/65, 64; 714/23
See application file for complete search history.

(56) References Cited

U.S. PATENT DOCUMENTS

| | | | |
|---|---|---|---|
| 5,285,151 A * | 2/1994 | Akama et al. | 324/765 |
| 5,305,003 A | 4/1994 | Han et al. | |
| 6,768,952 B1 * | 7/2004 | Kantorovich et al. | 702/65 |
| 6,847,222 B1 * | 1/2005 | Muraya et al. | 324/765 |
| 2002/0149972 A1 | 10/2002 | Lamb et al. | |

FOREIGN PATENT DOCUMENTS

JP 2001 085622 A 3/2001

OTHER PUBLICATIONS

Isaac Kantorovich et al.; "Measurement of Milliohms of Impedance at Hundred MHz on Chip Power Slupply Loop"; Copyright 2002 IEEE; EPEP Proceedings; pp. 319-322.

* cited by examiner

*Primary Examiner*—Jermele Hollington
*Assistant Examiner*—Tung X. Nguyen
(74) *Attorney, Agent, or Firm*—Scott Hewett; Kim Kanzaki

(57) ABSTRACT

A packaged semiconductor device uses built-in self test to characterize voltage between points within the semiconductor die during a current discontinuity generated in the semiconductor die. The semiconductor die is operated to generate a current discontinuity, or several sequential current discontinuities, and the voltage is measured with an on-chip ADC. Measuring the voltage within the semiconductor die, rather than measuring at external test points, provides a more accurate prediction of device operation. Multiple test points are measured using a multiplexer, multiple ADCs, or by reconfiguring an FPGA. Impedance versus frequency information of the greater power distribution system connected to the semiconductor die is obtained by transforming the voltage and current through the semiconductor die measured during a current discontinuity.

25 Claims, 3 Drawing Sheets

POWER DISTRIBUTION SYSTEM BUILT-IN SELF TEST USING ON-CHIP DATA CONVERTER

FIELD OF THE INVENTION

This invention relates generally to digital logic devices, and more particularly to devices and methods for measuring the voltage of a power distribution system on a semiconductor die of the digital logic device coupled to the power distribution system.

BACKGROUND OF THE INVENTION

Electrical systems often include semiconductor devices with very demanding power requirements (e.g. providing for high current transients with stable voltage over a wide frequency range). It is desirable to know information about the electrical characteristics of the power distribution system ("PDS") that provides electrical power to the semiconductor device. For purposes of discussion, the term "device" refers to a packaged semiconductor device, and "die" refers to the semiconductor die ("chip") within the packaged device. "PDS" refers to the greater PDS, which includes not only the output ports of power supply, but also the printed circuit board ("PCB"), additional components mounted on the PCB, and the package of the semiconductor device. Factors that can affect the performance of the PDS include voltage regulators, decoupling capacitors, power planes and sandwiches, power vias, solder lands, device package balls, package substrate planes and vias, and similar elements. The impedance of the PDS over all frequencies of interest (i.e. the frequencies at which the semiconductor device requires transient current, such as when several switching operations simultaneously occur in the semiconductor device, as well as steady-state direct current ("DC")) is frequently used as a figure of merit of the PDS.

Conventional techniques for accurately determining the relevant impedance have several drawbacks. One technique uses a network analyzer in either a 1-port or 2-port configuration to measure the impedance of a portion of the PDS. The network analyzer injects a stimulus into the network under test (i.e. the PDS) that sweeps all frequencies of interest while simultaneously measuring the reflected and/or transmitted energy. The PDS impedance can be derived from the reflected and/or transmitted energy.

This method uses test points on the PCB, whether built into the PCB solely for that purpose, or whether retrofitted to the PCB, such as when measurements are made through a pair of decoupling capacitor lands with the capacitor removed. However, even with the best of test points, this method does not provide an accurate measurement of the PDS impedance seen by the semiconductor die (i.e. at the chip) because it does not measure the portion of the PDS between the voltage present at the chip and the external test points. In particular, it does not measure parasitic contributions of the package and the portion of the PCB between the semiconductor device and the test points. Removing the lid of a packaged semiconductor device to expose interior test points on the die is impractical because it destroys the packaged device.

Another limitation of this method is that network analyzers are typically designed to measure impedance in the range of 50 ohms. A good PDS often has impedance in the range of tens or hundreds of milliohms, and sometimes much lower. It is difficult for a network analyzer designed to measure a 50-ohm system to accurately measure impedances orders of magnitude smaller.

Another technique measured high-frequency impedance of a power supply loop for a microprocessor using current switching in the microprocessor. The microprocessor was programmed to generate periodic, changing current draw containing relatively long DC fractions, one portion having low current draw ("cold"), and another portion having high current draw ("hot"). The hot portion contained four integer additions, and the cold portion had four integer no-ops per cycle. Test pads were provided on the package of the microprocessor to provide $V_{dd}$–$V_{ss}$ sensing. Calibrated sense resistors were used in series between the voltage regulation modules and the microprocessor to extract quiescent hot and cold $I_{dd}$ values. A digital oscilloscope was used to measure the voltages and process the data to provide impedance information. Many thousands of sweeps were taken with the oscilloscope and averaged to filter random noise.

While this approach avoids the limitations of measuring the PDS in a 50-ohm test system, it still does not account for the impedance of the PDS generated by the portion of the network between the test pads and the point(s) of interest in the microprocessor, such as the package impedance. The package impedance is particularly relevant for devices that are provided in a variety of package types.

Another limitation of this technique is that the data obtained is only relevant for the PCB that the microprocessor is loaded onto. Another PCB for the same electronic system might have different impedance due to manufacturing tolerances and variance in the loaded components. A PCB having a different layout and different components (such as different power supplies) would almost certainly have different impedance.

Therefore, it is desirable to more accurately characterize PDSs. It is further desirable to characterize PDSs for use with semiconductor devices in a variety of electronic systems and semiconductor dice in a variety of device packages, and to characterize the expected operation of a semiconductor device in an electronic system.

SUMMARY OF THE INVENTION

The present invention enables an electronic device with built-in self test for measuring voltage between on-die test points during a current discontinuity. In one embodiment, a packaged electronic device includes a semiconductor die in the package that is capable of generating a current discontinuity (i.e. a non-linear change in current through the electronic device). Examples of electronic devices capable of generating a current discontinuity include a microprocessor; a programmable logic device ("PLD"), such as a field-programmable gate array ("FPGA") or a complex programmable logic device ("CPLD"); or a microprocessor embedded in a PLD, either configured in the fabric of the PLD or being hard-wired within the fabric of the PLD. An on-chip voltage measuring device, such as an analog-to-digital converter ("ADC"), is configured to measure voltage versus time between on-chip test points during the current discontinuity. In a particular embodiment, the packaged electronic device is configurable to measure voltage across multiple sets of on-chip test points, such as different $V_{cc}$ planes or planelets of the semiconductor die. In some embodiments, a multiplexer switches different on-chip test points to the ADC; in other embodiments, an FPGA is re-configured to connect the ADC to the subsequent test points.

In a further embodiment, the current through the electronic device is measured during the current discontinuity and the current and voltage data are transformed to provide impedance versus frequency information of a PDS. It is generally desirable that the current discontinuity be sufficient to provide accurate characterization of the PDS up to the highest frequency of interest, which is the maximum frequency where significant energy is present. In a particular embodiment, the highest frequency of interest in an FPGA is about 1 GHz.

In a particular embodiment, an on-chip sense resistor is used and a second on-chip ADC concurrently measures the voltage across the sense resistor as the test voltage is measured. In an alternative embodiment, multiple current discontinuities are generated, and the on-chip ADC measures the test voltage during one current discontinuity, and measures the sense voltage during another, essentially identical, current discontinuity.

In another embodiment, voltage in a semiconductor die is measured by generating a current discontinuity in the semiconductor die of a packaged electronic device and measuring voltage across on-chip test points with an on-chip voltage measuring device, such as an ADC. The ADC converts the measured voltage into voltage data, which is output to on-chip memory or an on-chip processor, or is output to a pin of the packaged semiconductor device for external processing. In a particular embodiment, a current spike is generated in an FPGA by switching several CMOS devices at once. In a further embodiment, the current through the semiconductor device is measured, such as with an on-chip sense resistor or off-chip sense resistor, and the impedance of the PDS that powers the semiconductor device is characterized at the on-chip test points.

DETAILED DESCRIPTION OF THE DRAWINGS

The present invention enables built-in self test for characterizing the power supplied to a semiconductor die, such as a microprocessor or field-programmable gate array. Voltage-measuring capability, such as an analog-to-digital converter ("ADC"), is provided on the semiconductor die. The semiconductor die may be packaged in any one of a variety of types of packages, and used in a variety of applications. Providing voltage-measuring capability on the semiconductor die enables characterization of the performance of the PDS and/or semiconductor die for the type of package and circuit used in a particular application. Alternatively, providing on-chip voltage-measuring capability enables characterization of the semiconductor die in other applications, such as when the semiconductor die is mounted directly to the PCB, used in a hybrid microcircuit, or is partially encapsulated.

Figure 1A:
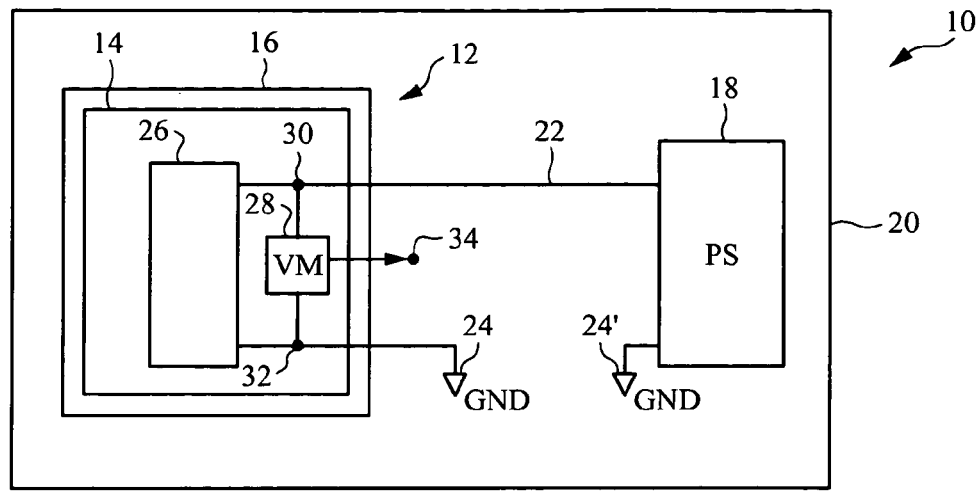
FIG. 1A is a simplified diagram of an electronic system according to an embodiment of the present invention.

FIG. 1A is a simplified diagram of an electronic system 10 according to an embodiment of the present invention. An electronic device 12, such as a packaged microprocessor, application-specific integrated circuit ("ASIC"), FPGA, or other device that has the potential for drawing large, transient current, includes a semiconductor die 14 in a package 16. A power supply 18 provides electric power to the semiconductor die 14 though a transmission network 22 of traces, planes, and vias (not separately shown) of the PCB 20 to the electronic device 12. Alternatively, power is supplied from an off-board supply, and brought to the PCB 20 through a pin or other electrical connection.

The transmission network 22 optionally includes additional elements, such as resistors, capacitors, or inductors. Current is returned from the electronic device 12 to the power supply 18 through board grounds 24, 24'. Additional impedance arises between the board ground 24 that the electronic device 12 is connected to and the board ground 24' that the power supply is connected to (see, FIG. 1B, $Z_{PCB2}$).

The semiconductor die 14 includes a "fabric" portion 26 (i.e. digital and/or analog circuitry, such as the core logic of an FPGA) and on-chip voltage-measuring device 28. In a particular embodiment, the on-chip voltage-measuring device is an ADC. The ADC is an on-chip data converter that converts the analog voltage data taken across the test points 30, 32 to digital data, which is provided at an output pin 34 of the electronic device 12. Typical electronic devices have several pins, which are not shown for simplicity of illustration. Alternatively, the digital data is coupled to an on-chip data processor (see FIG. 2A, ref. num. 44), such as an embedded microprocessor, for example an IBM POWER PC™ microprocessor hardwired in the fabric of a PLD, an embedded microprocessor implemented (configured) in the fabric of a PLD (e.g., a softcore), or a dedicated digital signal processor ("DSP") embedded in the fabric of an FPGA or other PLD.

The digital data at the output pin 34 can be coupled to an on-board data processor, such as a general-purpose processor or a specialized processor, e.g., a DSP, in a separate chip (not shown), or coupled to an external data processor, such as a digital oscilloscope, through a pin (not shown) of the PCB 20. An on-board or on-chip processor can provide data for external analysis, such as in a personal computer ("PC") or workstation, using an application such as MATLAB™, available from THE MATHWORKS, INC. of Natick, Mass.

Figure 1B:
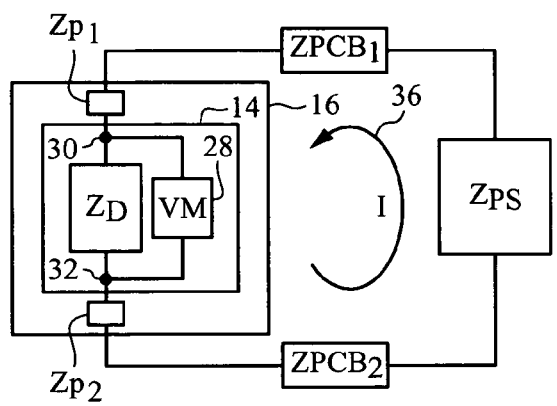
FIG. 1B is a simplified representation of the impedance networks of the electronic system shown in FIG. 1A.

FIG. 1B is a simplified representation of impedance networks of the electronic system shown in FIG. 1A. The on-chip voltage-measuring device 28 measures voltage across test points 30, 32. In a configurable device, such as an FPGA, the user may select where the test points are in the semiconductor die 14, and may test successive points to more fully characterize the PDS impedance seen at different points of the semiconductor die 14.

When current is supplied by the power supply (see FIG. 1A, ref. num. 18), the on-chip voltage-measuring device 28 measures the voltage between the test points 30, 32. The current I (represented by the curved arrow 36), flowing through the semiconductor device is $V/(Z_D+Z_{P2}+Z_{PCB2}+Z_{PS}+Z_{PCB1}+Z_{P1})$ where V is the voltage between the test points 30, 32, $Z_D$ is the impedance of the fabric portion (see FIG. 1A, ref. num. 26) of the semiconductor die, $Z_{P2}$ is the package impedance between the test point 32 and the PCB, $Z_{PCB2}$ is the impedance of the PCB network between the package and the power supply, $Z_{PS}$ is the impedance of the power supply, $Z_{PCB1}$ is the impedance of the PCB network between the power supply and the package, and $Z_{P1}$ is the package impedance between the PCB and the test point 30.

Figure 1C:
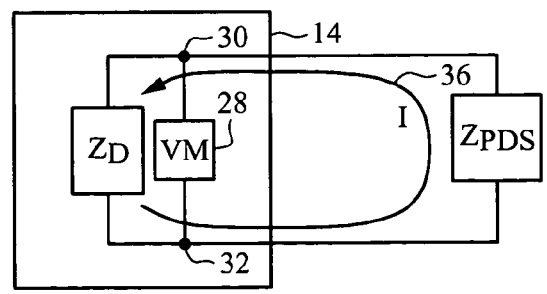
FIG. 1C is a simplified representation of the impedances shown in FIG. 1B.

FIG. 1C is a simplified representation of the impedances shown in FIG. 1B. The on-chip voltage-measuring device 28 measures the voltage between the test points 30, 32. Current I (represented by the curved arrow 36) is shown as flowing through $Z_D$ and $Z_{PDS}$. $Z_{PDS}$ is the impedance of the greater power distribution system (i.e. the sum of $Z_{P2}+Z_{PCB2}+Z_{PS}+Z_{PCB1}+Z_{P1}$), as discussed above in reference to FIG. 1B. The current is not shown flowing through the on-chip voltage-measuring device 28 because such circuitry typically has very high input impedance and draws negligible current. In practice, $Z_D$ is also typically much higher than $Z_{PDS}$. For example, the voltage drop across an exemplary silicon device is 3.1 volts DC in an electrical system with a power supply providing 3.3 volts at its output. Applying Ohm's Law, $Z_D$ is about 15.5 times greater than $Z_{PDS}$, so the voltage measured across the on-chip test points accurately characterizes the impedance of the PDS and the expected operation of the electronic device.

Figure 2A:
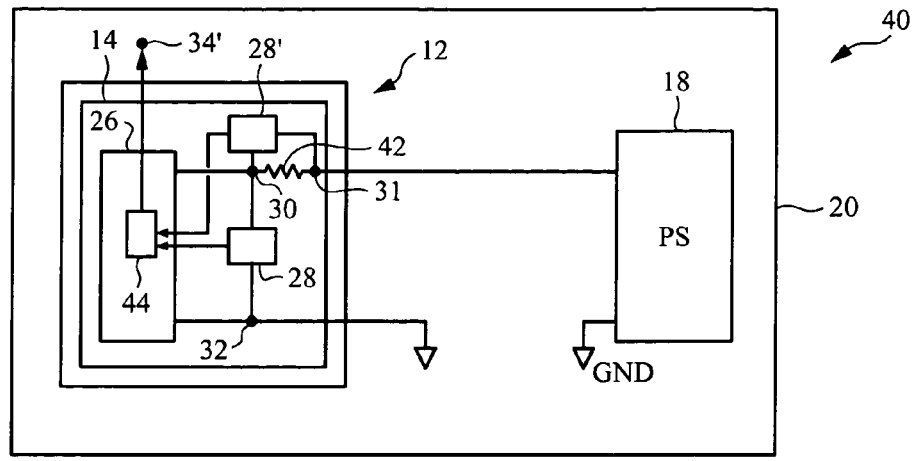
FIG. 2A is a simplified diagram of an electronic system according to another embodiment of the present invention.

FIG. 2A is a simplified diagram of an electronic system 40 according to another embodiment of the present invention. A calibrated sense resistor 42 is provided on the semiconductor die 14. A second on-chip voltage-measuring device 28' is provided to measure the voltage across the sense resistor 42 to obtain the current flowing from the PDS through the semiconductor die 14. The on-chip voltage-measuring device 28 measures the voltage across the test points 30, 32 (i.e. across the fabric portion 26 of the semiconductor die 14). The data from the on-chip voltage measuring devices 28, 28' are coupled to an on-chip data processor 44, which is incorporated in the fabric portion 26 of the semiconductor die 14. The on-chip data processor 44 provides voltage, current, and/or impedance data at an output pin 34' of the electronic device 12. In a further embodiment, data from the on-chip data processor is coupled to on-chip or on-board memory (not shown), and is output from the PCB 20 for external analysis or analysis is performed in the semiconductor die 14 or elsewhere on the PCB 20.

Knowing both the current and the voltage from the PDS to the chip allows one to calculate the impedance of the PDS, namely $Z_{PDS}$ (see FIG. 1C). A sense resistor typically has very low resistance, and in particular embodiments has very low reactance at high frequency, particularly when the sense resistor is integrated on the semiconductor die 14. In other words, the sense resistor does not significantly affect $Z_{PDS}$, and may be placed at any of several locations in the on-chip current path.

Characterizing a power supply or PDS at quiescent (DC) levels is relatively easy. However, many electronic devices operate at very high frequencies, where inductive and capacitive reactance can be a major portion, and even dominate, the impedance of the PDS. One way to characterize the PDS under high-frequency operating conditions is to create a known current discontinuity (e.g. a step, a spike, or a trapezoid) and measure the voltage waveform across voltage test points. As is commonly known in signal theory, current discontinuities contain transient high frequency information. A transform function, such as a Fourier transform function, is used to convert the time-domain impedance measurements (voltage across and current through the device) into the frequency domain to derive a plot of impedance versus frequency.

Referring again to FIG. 1A, the fabric portion 26 of the semiconductor die 14 is capable of creating a current step, and the voltage waveform is measured across the test points 30, 32 with the on-chip voltage-measuring device 28. For example, if the semiconductor die is a microprocessor, a trapezoidal current waveform is created by programming the microprocessor to perform functions that consume a relatively high amount of current for a selected period of time, and then to cease performing those functions for a second selected period of time, over and over to achieve an essentially trapezoidal current waveform. Alternatively, an FPGA is programmed in a similar fashion, or an embedded microprocessor in an FPGA is operated to generate a trapezoidal current waveform.

FPGAs are highly parallel devices compared to typical microprocessors. That is, entire logic blocks (commonly known as configurable logic blocks, or "CLBs") are typically accessible in an FPGA, and entire blocks or even large groups of blocks have their logic states simultaneously changed (for example, from a logic 1 to a logic 0 or a logic 0 to a logic 1). When a CLB logic state is changed, a relatively large amount of current is briefly drawn by the FPGA. Microprocessors are more "serial" and often have features, such as branch prediction and latency, that affect the types of transitions that can be generated. Furthermore, an FPGA can be designed or configured to produce a transition (step), whereas microprocessor logic is relatively static.

In an FPGA, more granularity is available and a user can create a wide variety of current discontinuities and waveforms. For example, the user can change the states of twenty CLBs in parallel instead of ten, producing a current discontinuity with greater magnitude. Furthermore, it may be possible, in light of this granularity, to create arbitrary current waveforms (e.g. first, change the states of five CLBs on the first clock cycle, then three more CLBs on the next clock cycle (for a total of eight), then two more CLBs on the next clock cycle (for a total of ten), then change the states of the two more CLBs, then change the states of the three more CLBs, then change the states of the five CLBs, thereby forming a current mode digital to analog converter ("DAC")).

Alternatively, current waveforms could be generated by routing the known clock skews to different current-drawing resources (e.g. different CLBs). A phase difference in the signal assertion to different current-drawing resources will arise because of the skew in the clock tree. Using the clock skews to turn on different current-drawing resources provides much finer granularity in the arbitrary current waveform because the current-drawing recourses are accessed between clock cycles.

An FPGA is alternatively programmed to create a periodic control voltage with sharp transitions that produce momentary high current draw. Complementary metal-oxide-semiconductor ("CMOS") devices draw current when they are turned on or off, and draw essentially no current after changing states. In a particular embodiment, several gates in an FPGA are simultaneously turned on and off. For example, a square-wave control voltage is used to switch several hundreds or thousands, or more, flops from a logical 0 to a logical 1 and back again in a periodic fashion. The control voltage to the gates is a square wave, for example.

The clock skew for the control voltage square-wave between different transistors working in parallel is about 200 pico-seconds ("pS"); in other words, it can take up to 200 pS to turn on all the flip-flops. When the flip-flops turn on (or off), a current transient is generated (i.e. the current drawn by the semiconductor die is relatively high for a short duration). It is believed that a 200 pS clock delay produces current transients for accurate characterization of a PDS up to one GHz, and possibly up to 2 GHz, and even higher, if reduced accuracy is acceptable. A current transient of shorter duration produces accurate measurements to higher frequencies.

In some embodiments, measuring the voltage waveform across the test points 30, 32 provides data that is useful in characterizing the performance of the semiconductor die within the harmonic frequency range of the device, which in a particular embodiment is about 1 GHz. This feature is enabled by having on-chip voltage measurement capability. The user, or system or chip designer, can evaluate the voltage provided by the PDS and determine whether it produces a sufficiently low level of noise voltage in the electronic device to avoid jitter and/or bit errors.

If the semiconductor die 14 is a configurable device, such as an FPGA, the voltage provided to the configurable device and/or impedance of the PDS may be characterized for different device configurations or operating conditions. For example, a particular configuration might draw more current than the PDS can supply, resulting in noise, jitter, or bit errors. In that instance, a user might choose to re-design the electronic system.

Figure 2B:
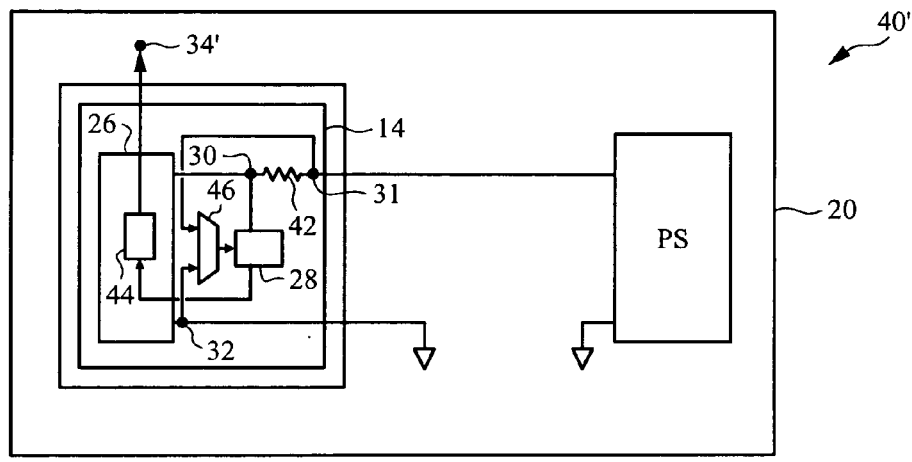
FIG. 2B is a simplified diagram of an electronic system according to another embodiment of the present invention.

FIG. 2B is a simplified diagram of an electronic system 40' according to another embodiment of the present invention. A single on-chip voltage measuring device 28 is used in combination with a multiplexer 46. The multiplexer 46 switches the inputs to the on-chip voltage measuring device 28 from the test points 30, 32 across the fabric portion 26 of the semiconductor die 14 to the test points 30, 31 across the sense resistor 42. The voltage across the fabric portion 26 will be measured for one or more cycles, and then the voltage across the sense resistor 42 will be measured for one or more cycles. This technique assumes repeatability of the PDS impedance, current draw, and trigger timing. In some embodiments, the trigger times are mathematically initialized after the current and voltage data are taken. Using two on-chip voltage measuring devices, as shown in FIG. 2A, provides real-time voltage and current data from a common triggering event, such as a single clock signal. In other embodiments, a multiplexer switches between multiple test points on the semiconductor die.

Data from the on-chip voltage measuring device 28 are provided to the on-chip data processor 44. Output from the on-chip data processor 44 is provided at the output pin 34'.

Figure 2C:
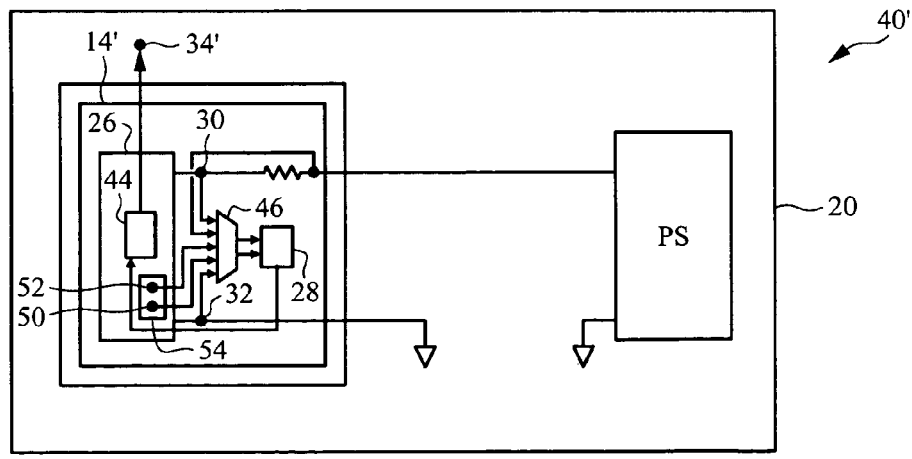
FIG. 2C shows a portion of a semiconductor die coupled to a multiplexer configured to switch the on-chip voltage measuring device between multiple test points.

FIG. 2C shows a portion of a semiconductor die 14' coupled to a multiplexer 46 configured to switch the on-chip voltage measuring device 28 between multiple test points. A first voltage waveform is taken across the first set of test points (e.g. 30, 32) and then the multiplexer switches to other tests points 50, 52 within the semiconductor die 14' and a second voltage waveform is taken. Subsequent waveforms are taken across other test points in further embodiments. For example, the second set of test points is a $V_{cc}$ plane or $V_{cc}$ AUX planelet 54 in the semiconductor die in some embodiments, and is at an end of a bus, optionally after an on-chip voltage regulator, in other embodiments.

Data from the on-chip voltage measuring device 28 are provided to the on-chip data processor 44. Output from the on-chip data processor 44 is provided at the output pin 34'.

In another embodiment, a sense resistor and a second ADC are on the PCB 20. Clock delay between the on-chip ADC and on-board ADC is within the 200 pS window in some embodiments. In other embodiments, the difference in clock delay is characterized and accounted for in post-measurement data processing, or is electronically synchronized.

Figure 3:
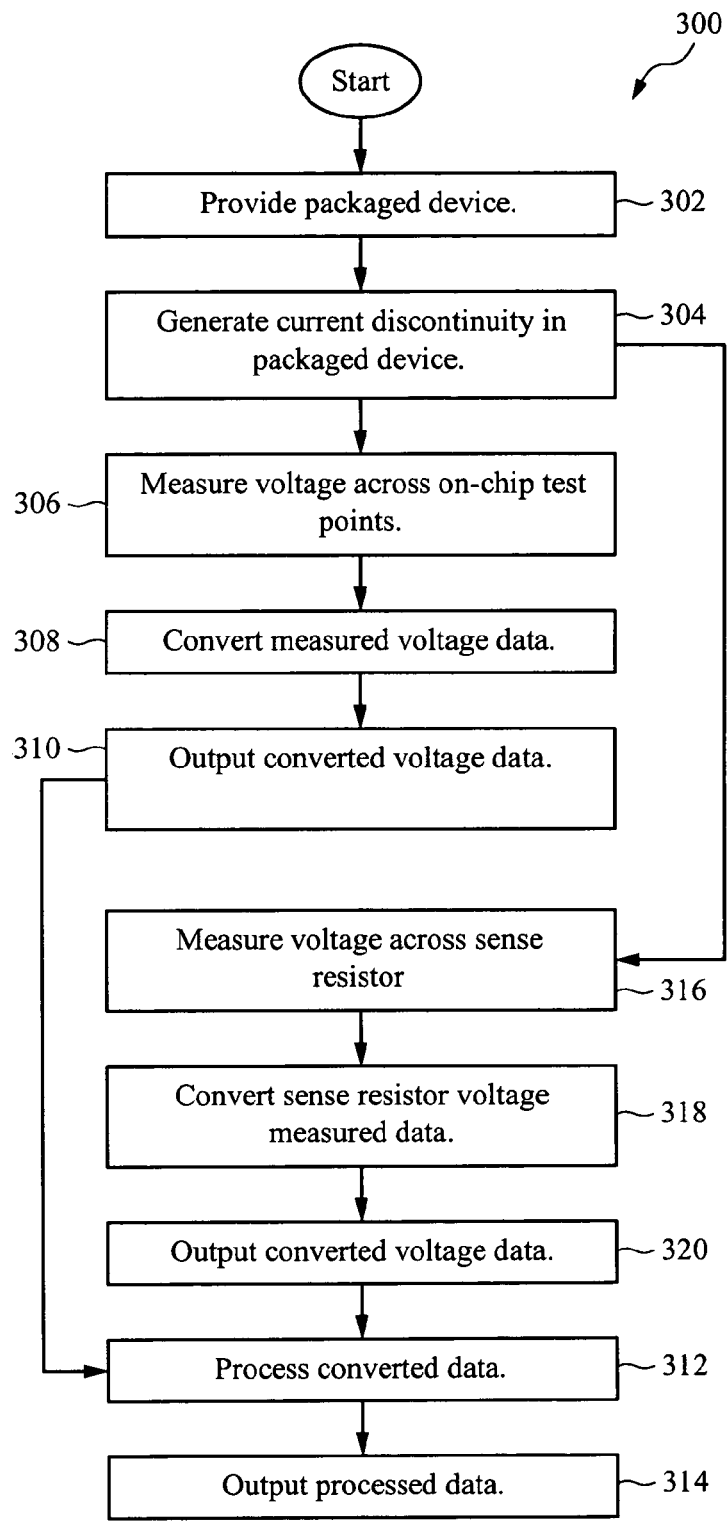
FIG. 3 is a flow chart of a method of characterizing voltage in a semiconductor device according to an embodiment of the present invention.

FIG. 3 is a flow chart 300 of a method of characterizing voltage in a semiconductor die according to an embodiment of the present invention. A packaged semiconductor device with an on-chip voltage measuring device and capability to be operated to generate a current discontinuity is provided (step 302). A current discontinuity is generated in the packaged semiconductor device (step 304), and voltage across on-chip test points in the packaged semiconductor device is measured during the current discontinuity with the on-chip voltage measuring device (step 306). The measured voltage data is converted (step 308) and output (step 310).

In a further embodiment, converted data are optionally output to a processor, which may be an off-chip processor or an on-chip processor and processed (step 312). The processed data are typically output (step 314) to an electronic memory, a display, or a printer, for example.

In another embodiment, voltage across a sense resistor is measured (step 316). In the illustrated embodiment, the voltage across the sense resistor is measured concurrently with the voltage across the on-chip test points in step 306 during the current discontinuity. In an alternative embodiment, a second current discontinuity is generated in the packaged device (not shown), and the voltage across the sense resistor is measured during the second current discontinuity.

The measured sense resistor voltage is converted to second voltage measurement data (step 318). Converted sense resistor data are output (step 320) to a processor and processed (step 312). The processor used in this step is the same processor used to process the converted voltage data from step 310, but alternatively a different processor is used. The processor processes the data and outputs processed data (step 314). In some embodiments, the processor outputs voltage versus time data, such as from the on-chip test points. In other embodiments, the processor outputs impedance versus frequency data, such as the impedance versus frequency of the PDS as-seen from the on-chip test points.

In the foregoing specification, the invention has been described with reference to specific exemplary embodiments thereof. Other embodiments will be apparent to those of ordinary skill in the art. For example, microprocessors and FPGAs have been used in specific examples, but other types of devices are used in alternative embodiments, particularly devices that draw large amounts of current and have a voltage data converter on board. Thus, it is evident that various modifications and changes may be made thereunto without departing from the broader spirit and scope of the invention as set forth in the appended claims and their full scope of equivalents.

What is claimed is:

1. An electronic device comprising:
   a package;
   a semiconductor die disposed in the package capable of generating a current discontinuity and an on-chip voltage measuring device configured to measure voltage versus time between on-chip test points during the current discontinuity; and
   a multiplexer disposed between a first on-chip test point and the on-chip voltage measuring device and between a second test point and the on-chip voltage measuring device, the multiplexer capable of selectively switching an input of the on-chip voltage measuring device between the first on-chip test point and the second on-chip test point.

2. The electronic device of claim 1 wherein the voltage represents voltage supplied by a greater power distribution system to the semiconductor die.

3. The electronic device of claim 1 wherein the semiconductor die comprises a programmable logic device.

4. The electronic device of claim 3 wherein the programmable logic device includes an embedded microprocessor.

5. The electronic device of claim 3 wherein the programmable logic device comprises a field-programmable gate array and a processor.

6. The electronic device of claim 1 wherein the semiconductor die comprises a microprocessor.

7. The electronic device of claim 1 wherein the current discontinuity is a current spike.

8. The electronic device of claim 1 wherein the on-chip test points are configurable within the semiconductor die.

9. The electronic device of claim 1 wherein the current discontinuity is sufficient to characterize the voltage between the on-chip test points to 1 GHz.

10. The electronic device of claim 1 wherein the current discontinuity is sufficient to characterize the voltage between the on-chip test points to 2 GHz.

11. The electronic device of claim 1 further comprising a processor on the semiconductor die, the on-chip measuring device providing voltage data to the processor.

12. The electronic device of claim 11 wherein the processor transforms the voltage data to voltage versus frequency information.

13. The electronic device of claim 1 further comprising:
a sense resistor disposed in a current path of the fabric portion, and
a second on-chip voltage measuring device configured to measure a sense resistor voltage.

14. The electronic device of claim 1 further comprising:
a sense resistor disposed in a current path of the fabric portion, and
a second on-chip voltage measuring device configured to measure a sense resistor voltage, wherein the semiconductor die comprises a field-programmable gate array capable of generating a current spike sufficient to characterize the voltage between configurable on-chip test points to 1 GHz.

15. A method of characterizing voltage in a semiconductor die comprising:
providing a packaged semiconductor die with an on-chip voltage measuring device and capability to generate a current discontinuity;
generating the current discontinuity;
measuring voltage across on-chip test points in the packaged semiconductor die with the on-chip voltage measuring device;
converting the measured voltage into voltage data;
outputting the voltage data; and
wherein the current discontinuity is generated by turning on a first configurable logic block, and then, after a selected period, turning on a second configurable logic block to create a current waveform.

16. The method of claim 15 wherein the current discontinuity is generated in a field-programmable gate array.

17. The method of claim 16 wherein the current discontinuity is generated by turning on a configurable logic block.

18. The method of claim 15 wherein the selected period is a clock rate period.

19. The method of claim 15 wherein the selected period is a clock skew period.

20. The method of claim 15 wherein generating the current discontinuity comprises simultaneously actuating complimentary metal-oxide semiconductor devices to create a current spike.

21. The method of claim 15 further comprising
measuring sense voltage across a sense resistor,
outputting sense resistor voltage data to a processor, and
processing sense resistor voltage data to obtain current data.

22. The method of claim 21 wherein measuring the sense voltage occurs concurrently with measuring the voltage across the on-chip test points.

23. The method of claim 21 further comprising, after measuring the voltage across the on-chip test points, of generating a second current discontinuity, wherein the sense voltage is measured during the second current discontinuity.

24. The method of claim 23 wherein the sense resistor is disposed in the packaged semiconductor die and the sense voltage is measured with the on-chip voltage measuring device.

25. The method of claim 21 wherein the voltage data and the current data are processed to provide impedance versus frequency information of a power distribution system coupled to the on-chip test points.

* * * * *